United States Patent
Nakatake et al.

(10) Patent No.: US 6,785,108 B2
(45) Date of Patent: Aug. 31, 2004

(54) SEMICONDUCTOR EQUIPMENT

(75) Inventors: Hiroshi Nakatake, Tokyo (JP); Akihiko Iwata, Tokyo (JP); Toshiyuki Kikunaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 310 days.

(21) Appl. No.: 10/146,026

(22) Filed: May 16, 2002

(65) Prior Publication Data

US 2003/0095365 A1 May 22, 2003

(30) Foreign Application Priority Data

Nov. 22, 2001 (JP) .................................... 2001-357609

(51) Int. Cl.[7] ................................................ H02H 9/00
(52) U.S. Cl. ..................... 361/100; 361/56; 361/91.1; 361/111
(58) Field of Search ........................... 361/56, 58, 100, 361/111, 113, 115, 91.1, 90

(56) References Cited

U.S. PATENT DOCUMENTS 5,081,558 A * 1/1992 Mahler ...................... 361/13
5,206,782 A * 4/1993 Landmeier et al. ......... 361/154
5,536,980 A * 7/1996 Kawate et al. .............. 307/116
5,616,970 A    4/1997 Dittrich
5,946,178 A * 8/1999 Bijlenga .................... 361/91.5

FOREIGN PATENT DOCUMENTS

JP        11-262243        9/1999

* cited by examiner

*Primary Examiner*—Stephen W. Jackson
(74) *Attorney, Agent, or Firm*—Leydig, Voit & Mayer, Ltd.

(57) ABSTRACT

In semiconductor equipment, a switching timing adjuster is provided between insulated gate bipolar transistors and a control signal generator. The switching timing adjuster includes an input decision circuit that decides whether a signal output from the overvoltage protector is a signal that has been output due to a deviation in the switching timing at a turn-off or turn-on time, a signal holding circuit that holds a signal that is output from the input decision circuit, and a pulse formation circuit that forms a corrected switching control signal based on a signal held in the signal holding circuit and a switching control signal from the control signal generator.

8 Claims, 14 Drawing Sheets

SEMICONDUCTOR EQUIPMENT

FIELD OF THE INVENTION

The present invention relates to a gate driving circuit that corrects deviation of switching timing of self-extinction semiconductors that are connected in series.

BACKGROUND OF THE INVENTION

FIG. 15 is a circuit structure diagram that shows prior art semiconductor equipment described in Japanese Patent Application Laid-open Publication No. 11-262243. What is shown are gate driving circuits for MOS gate input self-extinction semiconductors that are connected in series. Reference numbers 50-1, 50-2, and 50-3 denote self-extinction semiconductors that are connected in series. Each of the self-extinction semiconductors 50-1, 50-2, and 50-3 receives a normal switching signal through a gate resistor 51, switches 52 and 53, and DC power sources 54 and 55, based on a switch signal control signal 56.

When a plurality of self-extinction type semiconductors are connected in series, the following problem occurs. That is, when the characteristics of the self-extinction type semiconductors or their driving unit change with time, or when the switching pattern has changed to change the temperature of the device, resulting in the occurrence of a difference in the characteristics, the switching timing of the self-extinction type semiconductors varies. This generates a difference in the transient bearing of voltage. In this case, the deviation of the switching timing is corrected as follows.

When the switching timing has deviated at the time of turning off the series-connected self-extinction type semiconductors, this deviation is corrected with a gate resistor 57, a switch 58, a DC power source 59, a driving circuit 60, a current detector 61, and a logic processing circuit 62. In other words, the current detector 61 detects a difference in currents that flow through upper and lower snubber circuits 70 that are connected in series, and detects a deviation in the switching timing at the turn-off time. The timing deviation is corrected by controlling a mirror period based on this detection.

When the switching timing has deviated at the time of turning on the series-connected self-extinction type semiconductors, this deviation is corrected with the gate resistor 57, a switch 63, a DC power source 64, a resistor 65, a reference power source 66, a comparator 67, a driving circuit 68, and the logic processing circuit 62. In other words, a large current flows to a gate terminal during a mirror period, thereby increasing turn-on speed. The deviation in the switching timing is reduced based on this increased turn-on speed.

Based on the above structure, the prior art semiconductor equipment reduces a deviation at the turn-on timing by increasing the turn-on speed. Therefore, a current change rate becomes high, and at this time, a recovery surge voltage that occurs in a freewheeling diode of the other arm becomes large. The surge voltage becomes higher when the timing variation is made smaller. It is possible to increase the turn-on speed only to a level at which the surge voltage is within a rated reverse voltage of the freewheeling diode. Therefore, it has not been possible to reduce the timing deviation at the turn-on timing to a sufficiently small level.

Further, the timing deviation at the turn-off time, is corrected based on the difference in currents that flow through the upper and lower snubber circuits that are connected in series. Therefore, when three transistors of early turn-off timing continue, and a transistor of late turn-off timing is connected to the above, for example, only the turn-off timing of a top transistor among the transistors of early turn-off timing is corrected to be late. The turn-off timing of the remaining two transistors of early turn-off timing is not corrected. Therefore, it has not been possible to accurately correct the timing deviation.

SUMMARY OF THE INVENTION

It is an object of this invention to provide a semiconductor equipment that is equipped with a gate driving circuit that can properly adjust a deviation in the switching timing.

The semiconductor equipment according to one aspect of the present invention comprises a plurality of self-extinction type semiconductors connected in series, each of the self-extinction type semiconductors having a control terminal; and a control signal generator that generates a predetermined switching control signal for controlling the self-extinction type semiconductors. Corresponding to each of the self-extinction type semiconductors there are provided an overvoltage protector that protects the self-extinction type semiconductor when an overvoltage has occurred in the self-extinction type semiconductor; and a switching timing adjuster provided between the control terminal of the self-extinction type semiconductor and the control signal generator. The switching timing adjuster has an input decision circuit that decides that a signal output from the overvoltage protector is a signal that has been output based on an occurrence of an overvoltage in the self-extinction type semiconductor due to a deviation in the switching timing at a turn-on or turn-off time; a signal holding circuit that holds a signal corresponding to the overvoltage that is output from the input decision circuit; and a pulse formation circuit that forms a corrected switching control signal based on a signal held in the signal holding circuit and a switching control signal from the control signal generator.

The semiconductor equipment according to another aspect of the present invention comprises a plurality of self-extinction type semiconductors connected in series, each self-extinction type semiconductor being connected with an overvoltage protector. A switch is provided which electrically disconnects the self-extinction type semiconductor and the overvoltage protector before the self-extinction type semiconductor is turned on.

Other objects and features of this invention will become apparent from the following description with reference to the accompanying drawings.

DETAILED DESCRIPTIONS

Embodiments of the semiconductor equipment according to the present invention will be explained in detail below with reference to the accompanying drawings.

Figure 1:
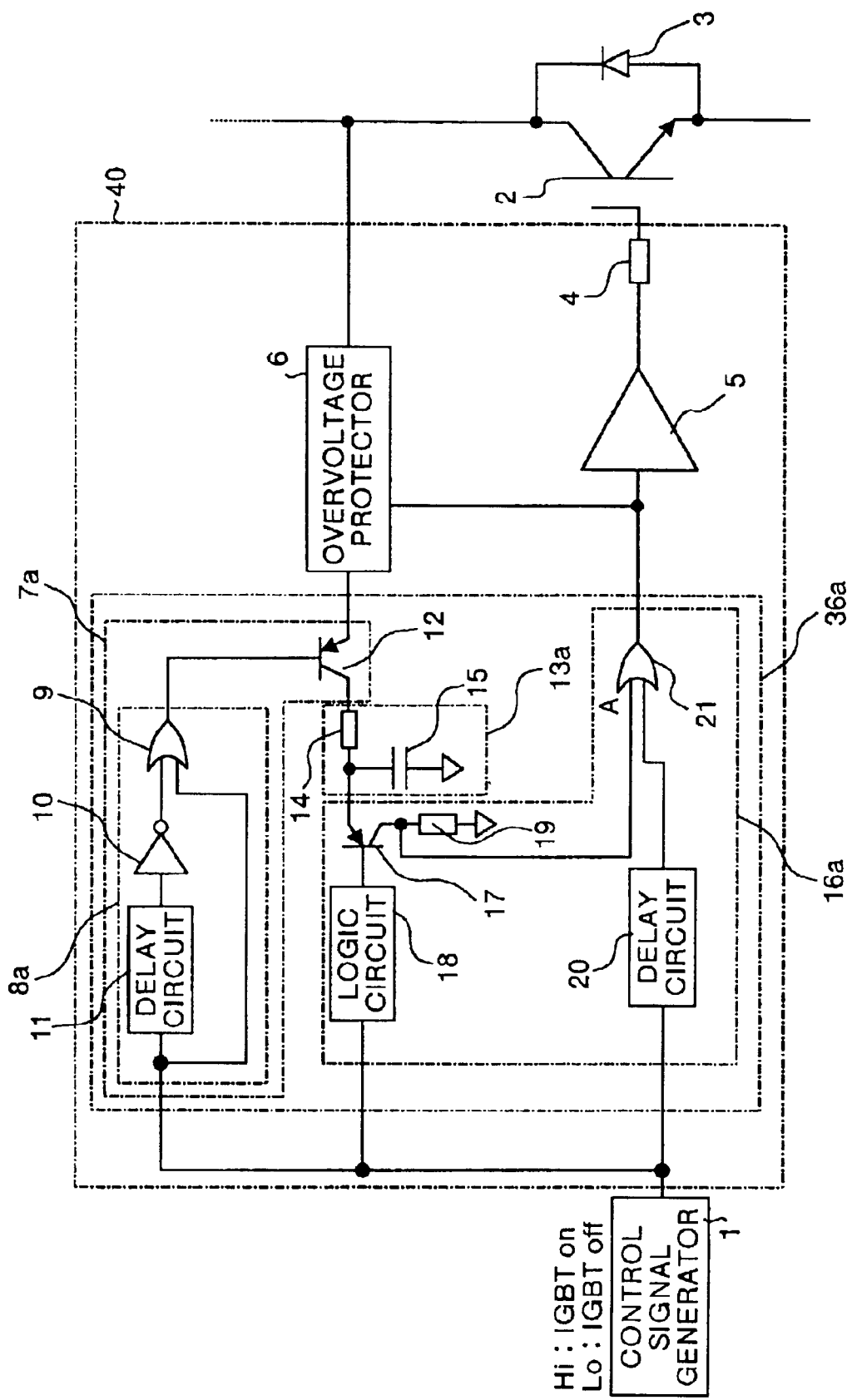
FIG. 1 is a circuit structure diagram that shows a main portion of a semiconductor equipment according to a first embodiment of the present invention, FIG. 2 includes time charts that explain the operation of the semiconductor equipment according to the first embodiment of the invention.
Figure 2:
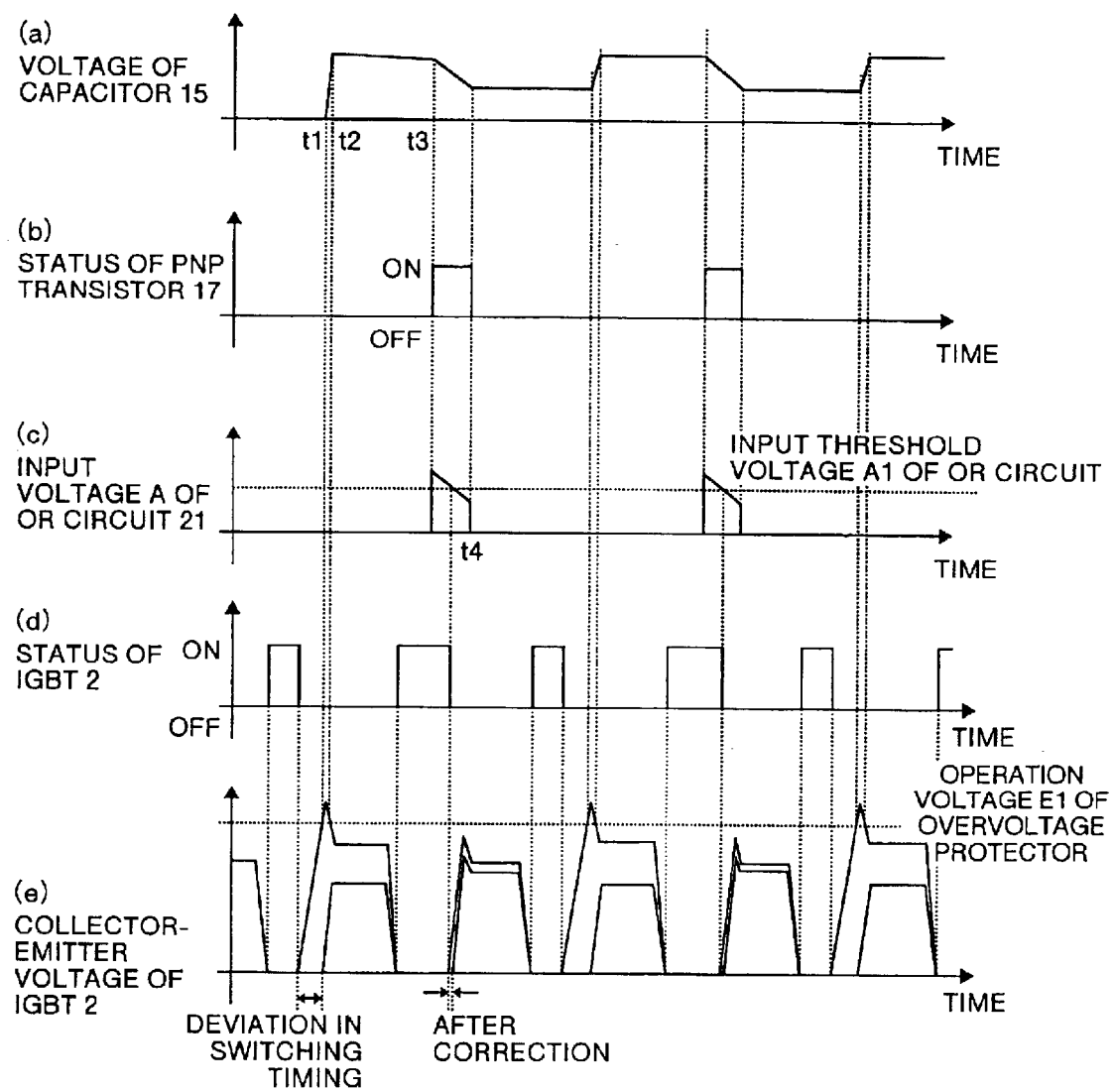

The semiconductor equipment according to a first embodiment of the present invention will be explained with reference to FIG. 1 and FIG. 2. FIG. 1 shows a circuit structure for correcting a deviation of a switching timing at the turn-off time, and FIG. 2 includes time charts for explaining this operation.

Referring to FIG. 1, a reference number 1 denotes a control signal generator that generates a predetermined switching control signal for controlling a self-extinction type semiconductor, and 2 denotes the self-extinction type semiconductor ("IGBT" (Insulated Gate Bipolar Transistor) will be used, but other self-extinction type semiconductor may be used)). A reference number 40 denotes a gate driving circuit that is provided between the control signal generator 1 and a control terminal of the IGBT 2. In the first embodiment, the gate driving circuit 40 has an overvoltage protector 6 that detects an overvoltage of the IGBT 2, and protects this IGBT 2.

A switching timing adjuster 36a is connected between the control signal generator 1 and a gate amplifier 5 that drives the IGBT 2. This switching timing adjuster 36a consists of an input decision circuit 7a, a signal holding circuit 13a, and a pulse formation circuit 16a. The input decision circuit 7a is constructed of a switching transient status detector 8a consisting of a delay circuit 11, a NOT circuit 10, and an OR circuit 9, and a PNP transistor 12. The input decision circuit 7a takes in a signal from the control signal generator 1, and a signal output from the overvoltage protector 6 (a signal corresponding to an overvoltage that exceeds an operation voltage E1 of the overvoltage protector). The input decision circuit 7a decides that the signal output from the overvoltage protector 6 is a signal that has been output based on the occurrence of an overvoltage in the IGBT 2, due to a deviation in the switching timing at the turn-off time.

In other words, in the first embodiment, when the PNP transistor 12 has been driven only during a period determined by the delay circuit 11 after a signal from the control signal generator 1 turn-off started, and when the overvoltage protector 6 has operated during this period, the switching transient status detector 8a outputs a signal output from the overvoltage protector 6 and decides that an overvoltage has occurred due to a deviation in the switching timing. The signal holding circuit 13a is constructed of a capacitor (an accumulator) 15, and an input resistor 14, and holds a signal from the input decision circuit 7a (a signal corresponding to an overvoltage that occurs due to a deviation in the switching timing at the turn-off time). The pulse formation circuit 16a is constructed of a logic circuit 18, a PNP transistor 17, a resistor 19, a delay circuit 20, and an OR circuit 21. The pulse formation circuit 16a causes a charge accumulated in the capacitor 15 of the signal holding circuit 13a to be discharged at the turn-off time at a rate of once per a plurality of times of switching. At the same time, the pulse formation circuit 16a forms a switching control signal that has been corrected based on this discharge signal and a switching control signal from the control signal generator 1.

In other words, the OR circuit 21 outputs an ON signal when an input discharge voltage is equal to or above a threshold voltage, and finally adds this ON signal to the switching control signal from the control signal generator 1, and outputs this signal. The switching control signal is added as a signal that has been delayed by a predetermined time in the delay circuit 20, as described later. A reference number 4 denotes agate resistor, and 3 denotes a freewheeling diode.

Figure 3:
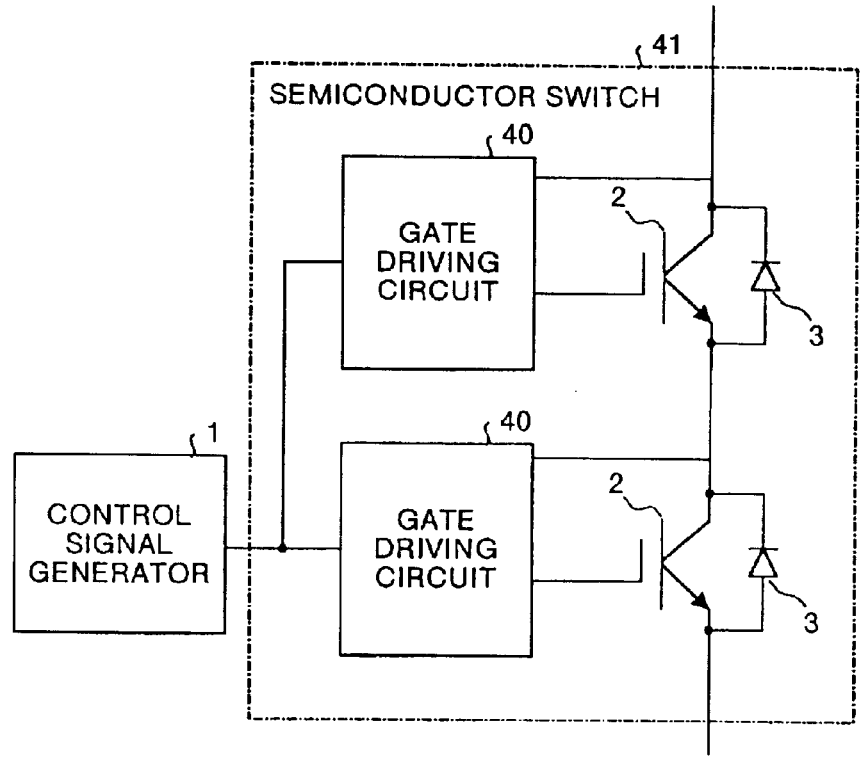
FIG. 3 is a circuit structure diagram that shows a semiconductor switch that uses a gate driving circuit according to the first embodiment of the invention.
Figure 4:
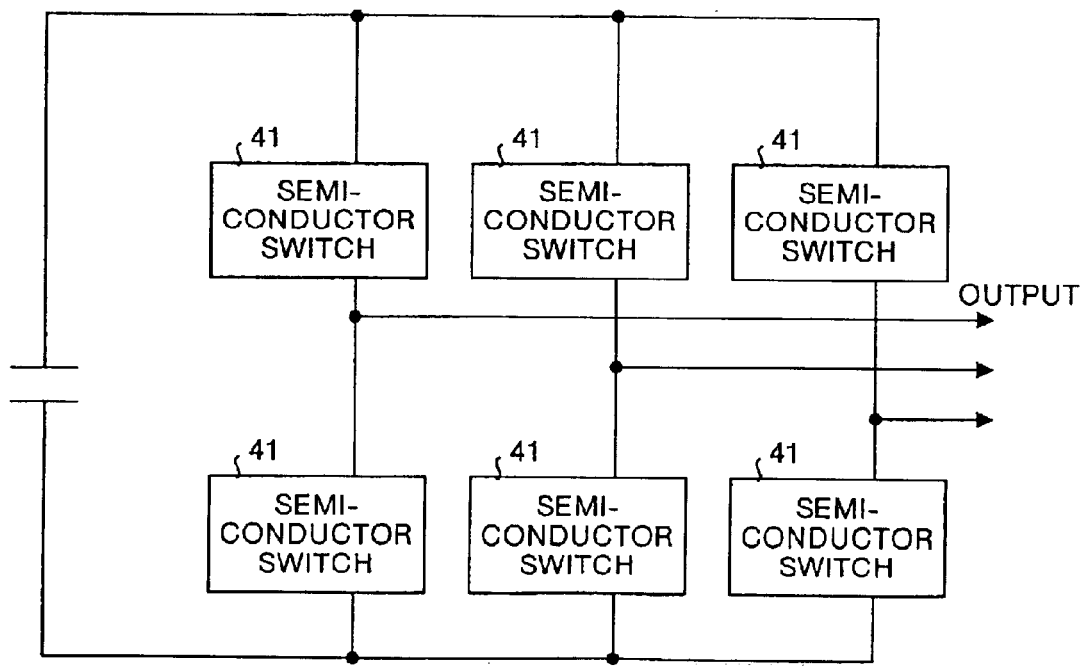
FIG. 4 is a circuit structure diagram that shows a three-phase two-level inverter that uses the semiconductor equipment according to the first embodiment of the invention.

FIG. 3 shows a structure of a semiconductor switch 41 that has been provided by connecting a plurality (two, in this case) of IGBT's 2 in series. Each IGBT 2 is connected in series with the freewheeling diode 3. Moreover, each IGBT 2 further connected with the gate driving circuit 40 having the above-described structure. FIG. 4 is a diagram of a three-phase two-level inverter that has been constructed of the semiconductor switches 41. The semiconductor switch 41 can be used not only for the two-level inverter but also for all semiconductor equipments.

The operation of the semiconductor equipment of the first embodiment will be explained next. In FIG. 2, (a) shows a change in time of a voltage of the capacitor 15 of the signal holding circuit 13a, (b) shows a change in time of a conduction status of the PNP transistor 17, (c) shows a change in time of an input voltage A of the OR circuit 21, (d) shows a change in time of a switching status of the IGBT 2, and (e) shows a change in time of a collector-emitter voltage of the IGBT 2. (a) to (e) show waveforms of a case in which two IGBT's 2 are connected in series. (e) shows voltage waveforms of the IGBT of early turn-off and the IGBT of late turn-off. (a) to (d) show waveforms of the IGBT of early turn-off.

The input decision circuit 7a causes a signal from the overvoltage protector 6 to be transmitted only during a period determined by the delay circuit 11 since a turn-off start of a switching control signal from the control signal generator 1. With this arrangement, the voltage of the capacitor 15 rises during a period from a time (t1) when the collector-emitter voltage of the IGBT that is turned off early has exceeded an operation voltage E1 of the overvoltage protector 6 until a time (t2) when the collector-emitter voltage of the IGBT has become lower than the operation voltage E1 of the overvoltage protector 6. The voltage of the capacitor 15 rises according to the operation of the overvoltage protector 6. In other words, the voltage of the capacitor 15 rises according to a level of overvoltage of the operation voltage E1 or above, and a time while the overvoltage is being applied. The logic circuit 18 drives the PNP transistor 17 at a rate of once per a plurality of times (at a rate of once per two times, in this case) of turn-off signals from the control signal generator 1. When the PNP transistor 17 has been turned on (at t3), the voltage of the capacitor 15 is discharged in a discharge circuit of the capacitor 15 and the resistor 19, and becomes low. The input voltage of the OR circuit 21 becomes substantially equal to the voltage of the capacitor 15. The ON status of the IGBT 2 lasts and the deviation of the switching timing becomes small, during a period while the input voltage of the OR circuit 21 is larger than an input threshold voltage A1 of the OR circuit 21 (from t3 to t4). The delay circuit 20 compensates for a time delay of the PNP transistor 17 and the logic circuit 18. As a result, the switching signal from the control signal generator 1 and the signal (the switching timing deviation correction signal) from the signal holding circuit 13a are synchronized.

As explained above, in the first embodiment, the switching timing is adjusted according to the operation of the overvoltage protector 6. Therefore, even when a time change has occurred in the characteristics of the IGBT 2 and the gate driving circuit 40, or when the cooling structure of the IGBT 2 or the switching pattern of the IGBT 2 has affected to generate a temperature difference between the series-connected IGBT's and thus the characteristics have changed during the continuous operation, the switching timing is automatically adjusted properly for each IGBT. Consequently, it is not necessary to manually adjust the switching timing.

Further, it is possible to reduce the loss in the overvoltage protector and the self-extinction type semiconductor generated due to a constant occurrence of a deviation in the switching timing.

Further, it is also possible to reduce the number of times of operating the overvoltage protector. Therefore, it becomes possible to improve the reliability of the overvoltage protector.

It is needless to mention, that the overvoltage protector 6 may be connected between the collector terminal and the gate terminal of the IGBT 2, or between the collector terminal and the emitter terminal of the IGBT 2.

Moreover, while the signal holding circuit 13a is constructed of the capacitor (the accumulator) 15 and the input resistor 14, it is also possible to discretely hold the signal from the input decision circuit 7a as a digital signal by using a memory, for example.

The semiconductor equipment according to a second embodiment of the present invention will be explained with reference to FIG. 5 and FIG. 6.

Figure 5:
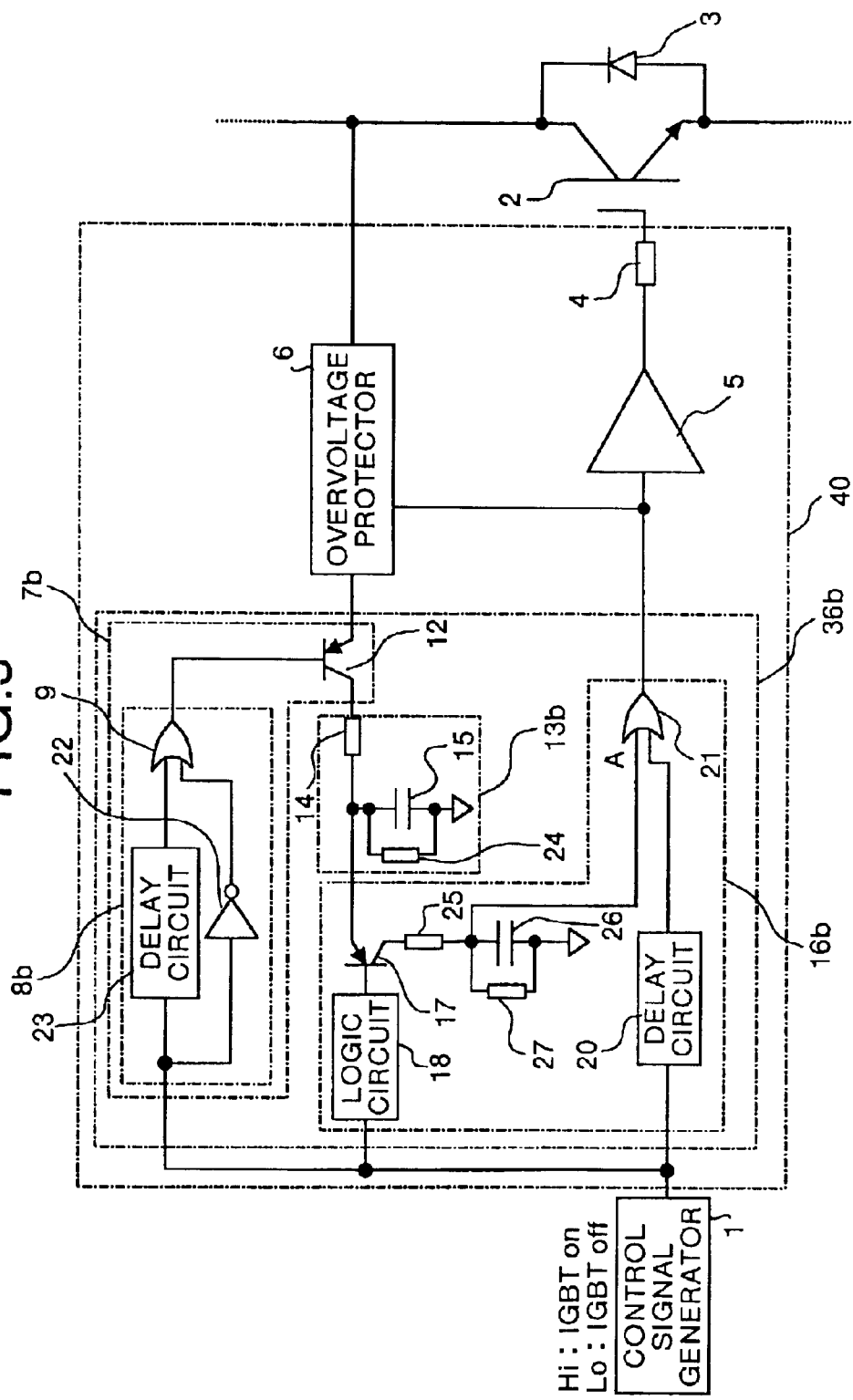
FIG. 5 is a circuit structure diagram that shows a main portion of a semiconductor equipment according to a second embodiment of the present invention, FIG. 6 includes time charts that explain the operation of the semiconductor equipment according to the second embodiment of the invention.
Figure 6:
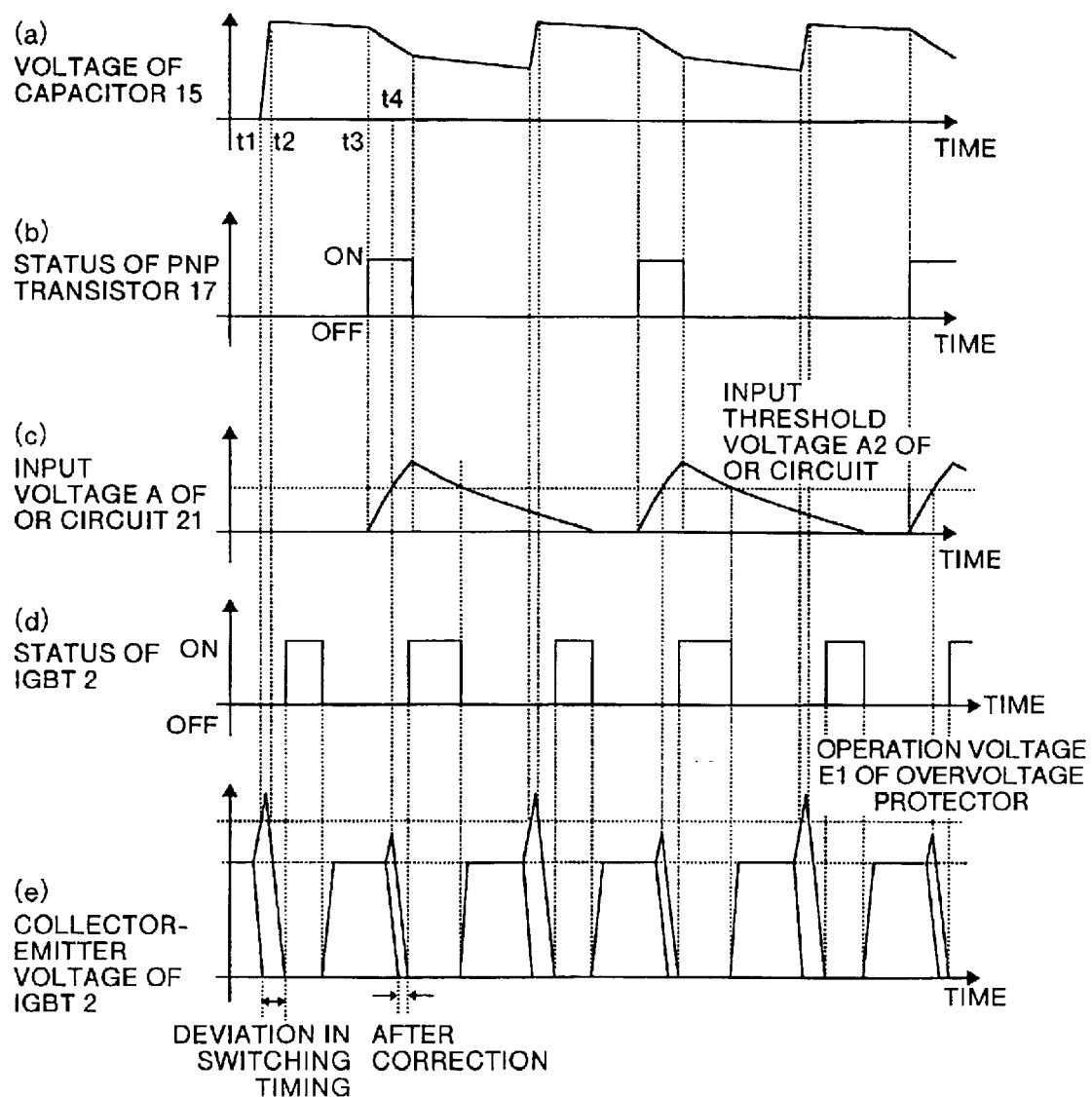

FIG. 5 shows a structure for correcting a deviation in the switching timing at the turn-on time, and FIG. 6 includes time charts for explaining this operation.

In FIG. 5, portions already explained in the first embodiment will be attached with the same reference numbers as those shown in FIG. 1, and their explanation will be omitted. Between the control signal generator 1 and the gate amplifier 5 that drives the IGBT 2, there is connected a switching timing adjuster 36b that consists of an input decision circuit 7b, a signal holding circuit 13b, and a pulse formation circuit 16b. The input decision circuit 7b is constructed of a switching transient status detector 8b consisting of a delay circuit 23, a NOT circuit 22, and an OR circuit 9, and a PNP transistor 12. The input decision circuit 7b inputs a signal from the control signal generator 1, and a signal output from the overvoltage protector 6 (a signal corresponding to an overvoltage that exceeds an operation voltage E1 of the overvoltage protector). The input decision circuit 7b decides that the signal output from the overvoltage protector 6 is a signal that has been output based on the occurrence of an overvoltage in the IGBT 2, due to a deviation in the switching timing at the turn-on time.

In other words, in the second embodiment, when the PNP transistor 12 has been driven only during a period determined by the delay circuit 23 after a signal from the control signal generator 1 turn-on started, and when the overvoltage protector 6 has operated during this period, the switching transient status detector 8b outputs a signal output from the overvoltage protector 6 and decides that an overvoltage has occurred due to a deviation in the switching timing. The signal holding circuit 13b is constructed of a capacitor (an accumulator) 15, an input resistor 14, and a discharge resistor 24, and holds a signal from the input decision circuit 7b (a signal corresponding to an overvoltage that occurs due to a deviation in the switching timing at the turn-on time). The pulse formation circuit 16b is constructed of a logic circuit 18, a PNP transistor 17, a resistor 25, a discharge resistor 27, a capacitor (an accumulator) 26, a delay circuit 20, and an OR circuit 21. The pulse formation circuit 16b causes a charge accumulated in the capacitor 26 of the signal holding circuit 13b to be charged to the capacitor 26 at the turn-on time at a rate of once per a plurality of times of switching. At the same time, the pulse formation circuit 16b forms a switching control signal that has been corrected based on this charge signal and a switching control signal from the control signal generator 1.

In other words, the OR circuit 21 outputs an ON signal when an input charge voltage is equal to or above a threshold voltage, and finally adds this ON signal to the switching control signal from the control signal generator 1, and outputs this signal. The switching control signal is added as a signal that has been delayed by a predetermined time in the delay circuit 20, as described later.

The signal holding circuit 13b of the second embodiment requires the discharge resistor 24 as the pulse formation circuit 16b does not have a discharging path of the capacitor 15 when the structure is the same as that of the signal holding circuit 13a of the first embodiment. A discharge time constant of the capacitor 15 and the discharge resistor 24 is selected to a time when the PNP transistor 17 is turned on a few times. The capacitance of the capacitor 15 is set larger than the capacitance of the capacitor 26 such that the voltage of the capacitor 15 is not lowered substantially when the PNP transistor 17 has been turned on. The time constant of the capacitor 26 and the discharge register 27 is set to a time constant to cause the capacitor 26 to discharge before the PNP transistor 17 is turned on next after the PNP transistor 17 has been turned on and the capacitor 26 has been charged.

The operation of the semiconductor equipment of the second embodiment will be explained next. In FIG. 6, (a) shows a change with time of a voltage of the capacitor 15 of the signal holding circuit 13b, (b) shows a change with time of a conduction status of the PNP transistor 17, (c) shows a change with time of an input voltage A of the OR circuit 21, (d) shows a change with time of a switching status of the IGBT 2, and (e) shows a change with time of a collector-emitter voltage of the IGBT 2. FIGS. 6(a) to 6(e) show waveforms of a case in which two IGBT's are connected in series. (e) shows voltage waveforms of the IGBT of late turn-on and the IGBT of late turn-off. (a) to (d) show waveforms of the IGBT of late turn-on.

The input decision circuit 7b causes a signal from the overvoltage protector 6 to be transmitted only during a period determined by the delay circuit 23 since a turn-on start of a switching control signal from the control signal generator 1. With this arrangement, the voltage of the capacitor 15 rises during a period from a time (t1) when the collector-emitter voltage of the IGBT that is turned on late has exceeded an operation voltage E1 of the overvoltage protector 6 until a time (t2) when the collector-emitter voltage of the IGBT has become lower than the operation voltage E1 of the overvoltage protector 6. The voltage of the capacitor 15 rises according to the operation of the overvoltage protector 6. The logic circuit 18 drives the PNP transistor 17 at a rate of once per a plurality of times (at a rate of once per two times, in this case) of turn-on signals from the control signal generator 1. When the PNP transistor 17 has been turned on (at t3), the input voltage A of the OR circuit 21 rises to the voltage of the capacitor 15 at the time constant of the resistor 25 and the capacitor 26, as the capacitance of the capacitor 15 is sufficiently larger than the capacitance of the capacitor 26. When the input voltage A of the OR circuit 21 has exceeded an input threshold voltage A2 (at t4), the IGBT 2 starts to be turned on. The delay circuit 20 compensates for a time delay of the PNP transistor 17 and the logic circuit 18. As a result, the switching signal from the control signal generator 1 and the signal (the switching timing deviation correction signal) from the signal holding circuit 13b are synchronized.

As explained above, in the second embodiment, the switching timing is adjusted according to the operation of the overvoltage protector 6, like in the first embodiment. Therefore, even when a change with time has occurred in the characteristics of the IGBT 2 and the gate driving circuit, or when the cooling structure of the IGBT 2 or the switching pattern of the IGBT 2 has affected to generate a temperature difference between the series-connected IGBT's and thus the characteristics have changed during the continuous operation, the switching timing is automatically adjusted properly for each IGBT. Consequently, it is not necessary to manually adjust the switching timing.

Further, it is possible to reduce the loss in the overvoltage protector and the self-extinction type semiconductor generated due to a constant occurrence of a deviation in the switching timing.

Further, it is also possible to reduce the number of times of operating the overvoltage protector. Therefore, it becomes possible to improve the reliability of the overvoltage protector.

Figure 7:
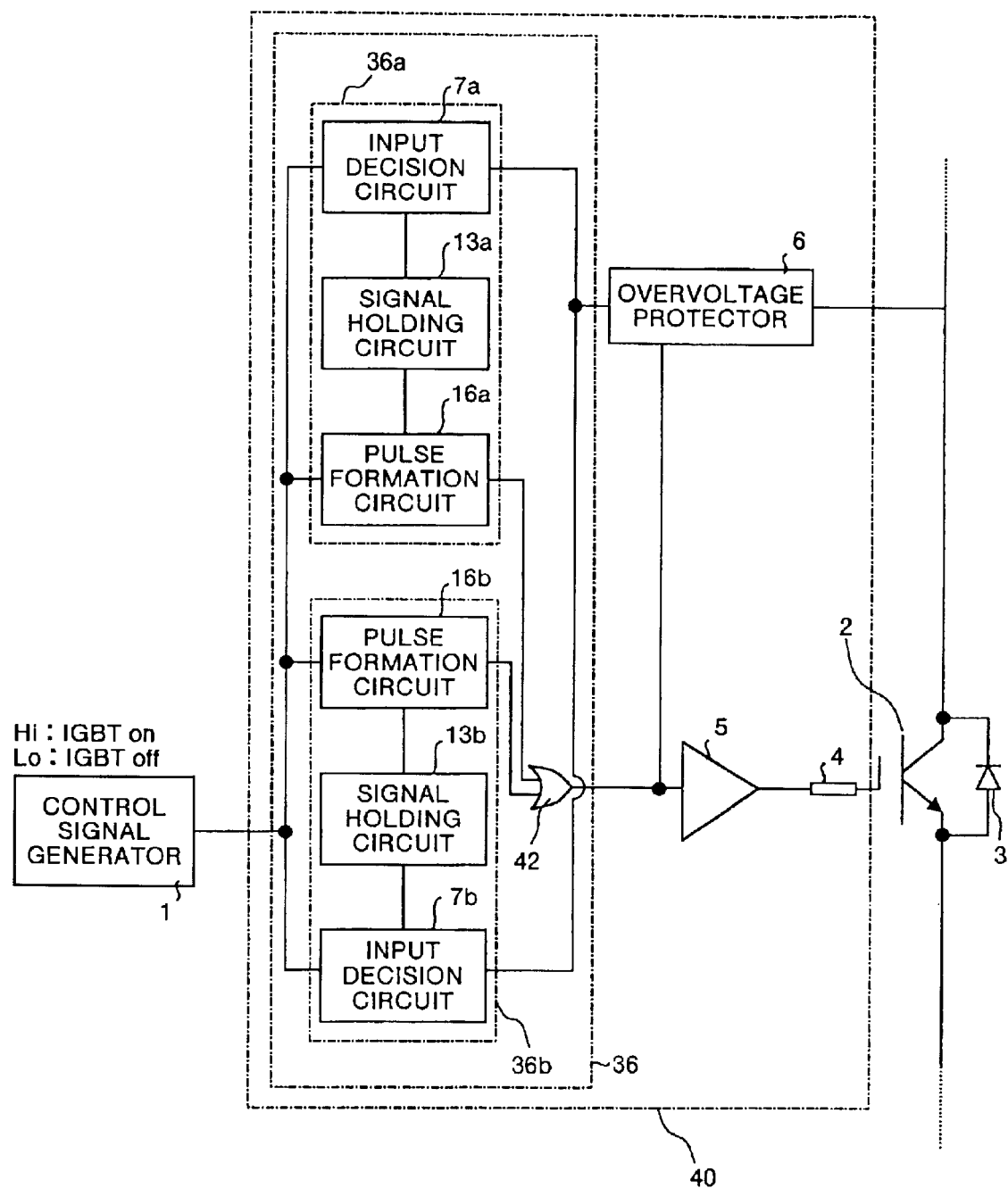
FIG. 7 is a circuit structure diagram that shows a main portion of a semiconductor equipment according to a third embodiment of the present invention.

The semiconductor equipment according to a third embodiment of the present invention will be explained with reference to FIG. 7. This semiconductor equipment has a structure for correcting a deviation in the switching timing at the turn-off time and the turn-on time. A reference number 36 denotes a switching timing adjuster. This switching timing adjuster 36 includes the switching timing adjuster 36a that adjusts a switching timing at the turn-off time described in the first embodiment, the switching timing adjuster 36b that adjusts a switching timing at the turn-on time described in the second embodiment, and an OR circuit 42. The switching timing adjuster 36a and the switching timing adjuster 36b are connected in parallel with inputs from the control signal generator 1 and the overvoltage protector 6 respectively, and input outputs of the switching timing adjuster 36a and the switching timing adjuster 36b to the OR circuit 42 respectively. An output of the OR circuit 42 is input to the gate amplifier 5.

The switching timing adjuster 36a and the switching timing adjuster 36b carry out the operation described in the first embodiment and the second embodiment respectively. The switching timing adjuster 36a outputs a signal obtained by adjusting the switching timing of the turn-off time, and the switching timing adjuster 36b outputs a signal obtained by adjusting the switching timing of the turn-on time. When these signals are added together in the OR circuit 42, it is possible to transmit a signal adjusted with the switching timing for the turn-on time and the turn-off time to the gate amplifier 5.

The semiconductor equipment according to a fourth embodiment of the present invention will be explained with reference to FIG. 8 and FIG. 9.

Figure 8:
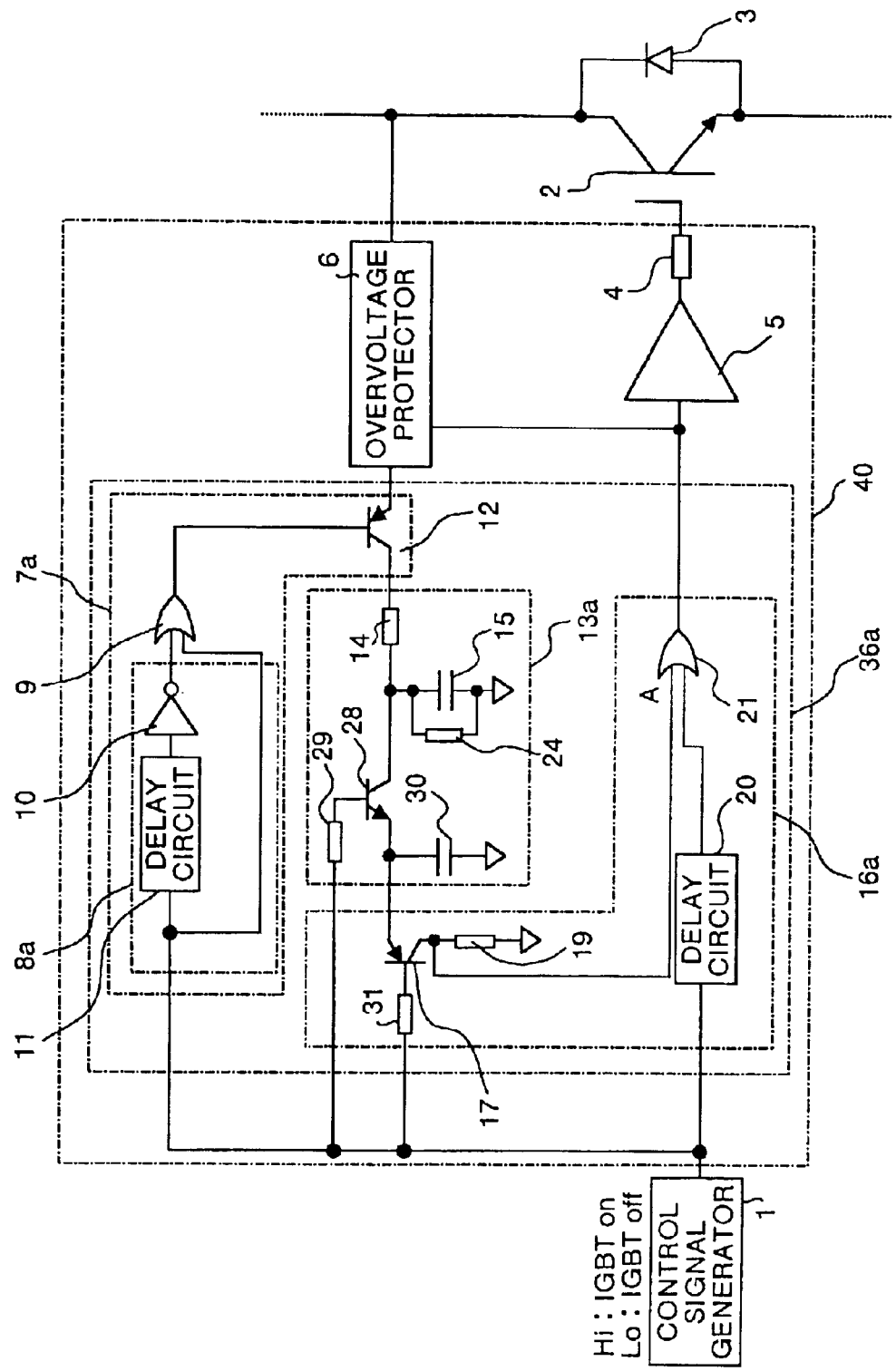
FIG. 8 is a circuit structure diagram that shows a main portion of a semiconductor equipment according to a fourth embodiment of the present invention, FIG. 9 includes time charts that explain the operation of the semiconductor equipment according to the fourth embodiment of the invention.
Figure 9:
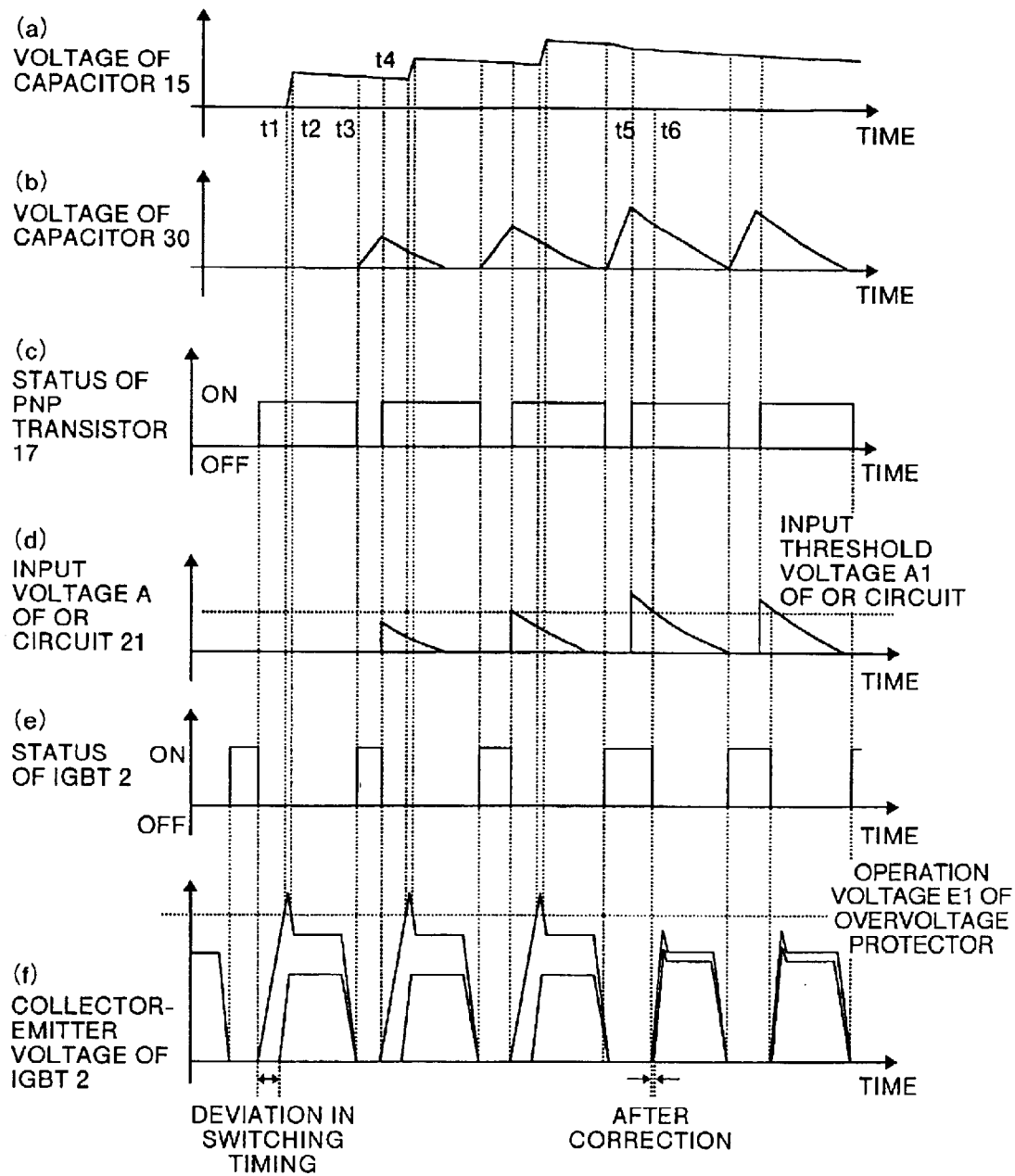

FIG. 8 shows a structure for correcting a deviation in the switching timing at the turn-off time, and FIG. 9 includes time charts for explaining this operation.

In the fourth embodiment, the signal holding circuit 13a includes a plurality of accumulators, and is constructed of an input resistor 14, a capacitor (a first accumulator) 15, a discharge resistor 24, an NPN transistor 28, a base resistor 29, and a capacitor (a second accumulator) 30. A pulse formation circuit 16a is constructed of a resistor 19, a PNP transistor 17, a base resistor 31, a delay circuit 20, and an OR circuit 21. The pulse formation circuit 16a causes a charge accumulated in the capacitor 30 of the signal holding circuit 13a to be discharged at each turn-off time, and forms a switching control signal that has been corrected based on this discharge signal and a switching control signal from the control signal generator 1. In other words, the OR circuit 21 outputs an ON signal when an input discharge voltage is equal to or above a threshold voltage, and finally adds this ON signal to the switching control signal from the control signal generator 1, and outputs this signal. The switching control signal is added as a signal that has been delayed by a predetermined time in the delay circuit 20.

The operation of the semiconductor equipment of the fourth embodiment will be explained next. In FIG. 9, (a) shows a change with time of a voltage of the capacitor (the first accumulator) 15, (b) shows a change with time of a voltage of the capacitor (the second accumulator) 30, (c) shows a change with time of a conduction status of the PNP transistor 17, (d) shows a change with time of an input voltage A of the OR circuit 21, (e) shows a change with time of a switching status of the IGBT 2, and (f) shows a change with time of a collector-emitter voltage of the IGBT 2. (a) to (f) show waveforms of a case in which two IGBT's are connected in series. (f) shows voltage waveforms of the IGBT of early turn-off and the IGBT of late turn-off. (a) to (e) show waveforms of the IGBT of early turn-off.

The input decision circuit 7a carries out a similar operation to that of the first embodiment. In the signal holding circuit 13a, the voltage of the capacitor 15 rises during a period (t1 to t2) when the collector-emitter voltage of the IGBT of early turn-off exceeds an operation voltage E1 of the overvoltage protector 6. The voltage of the capacitor 15 rises according to the operation of the overvoltage protector 6. Thereafter, the charge of the capacitor 15 shifts to the capacitor 30 when the IGBT 2 is turned on (at t3), and the voltage of the capacitor 30 becomes substantially equal to the voltage of the capacitor 15. In this case, the capacitance of the capacitor 15 is set larger than the capacitance of the capacitor 30 such that the voltage of the capacitor 15 is not lowered substantially. At t4, the PNP transistor 17 becomes in the ON status, and the charge accumulated in the capacitor 30 is discharged through the resistor 19. The turn-off of the IGBT 2 is delayed during a period (from t5 to t6) when the voltage of the capacitor 30 becomes the input voltage A of the OR circuit 21 and exceeds the input threshold voltage A1 of the OR circuit 21. Consequently, the deviation in the turn-off switching timing becomes smaller. The delay circuit 20 compensates for a time delay of the PNP transistor 17. As a result, the signal (the switching timing deviation correction signal) from the signal holding circuit 13a and the switching signal from the control signal generator 1 are synchronized.

In the first embodiment, the logic circuit 18 is used to correct a deviation in the switching timing at the turn-off time at the rate of once per a plurality of times. However, in the fourth embodiment, the charge accumulated in the capacitor 15 is shifted to the capacitor 30 at each turn-off time and this is utilized. Therefore, it is possible to correct the deviation in the switching timing continuously at each turn-off time.

Further, it is possible to drive the PNP transistor 17 at the timing of the switching signal. Therefore, the logic circuit 18 that is used in the first and second embodiments becomes unnecessary.

Further, a switch or an impedance element having large impedance for limiting a current is connected between a plurality of capacitors (accumulators), thereby to prevent the information from flowing out from the overvoltage protector when the information accumulated in the signal holding circuit is output to the pulse formation circuit. With this arrangement, it is possible to prevent such a state that the information from the overvoltage protector flows out straight to the pulse formation circuit, causing a continued ON status of the IGBT or making it impossible to correct the deviation in the switching timing.

The semiconductor equipment according to a fifth embodiment of the present invention will be explained with reference to FIG. 10 and FIG. 11.

Figure 10:
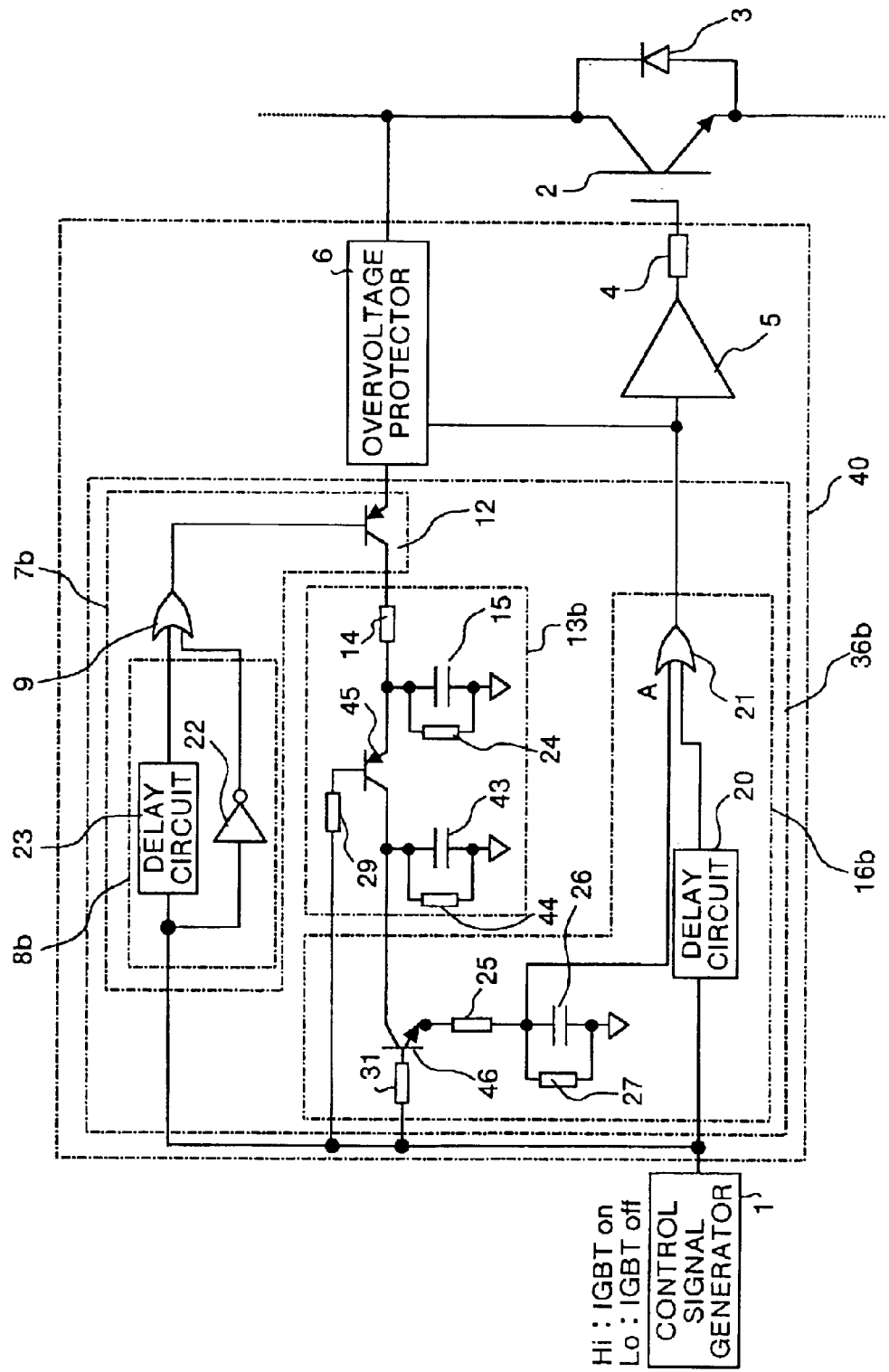
FIG. 10 is a circuit structure diagram that shows a main portion of a semiconductor equipment according to a fifth embodiment of the present invention, FIG. 11 includes time charts that explain the operation of the semiconductor equipment according to the fifth embodiment of the invention.
Figure 11:
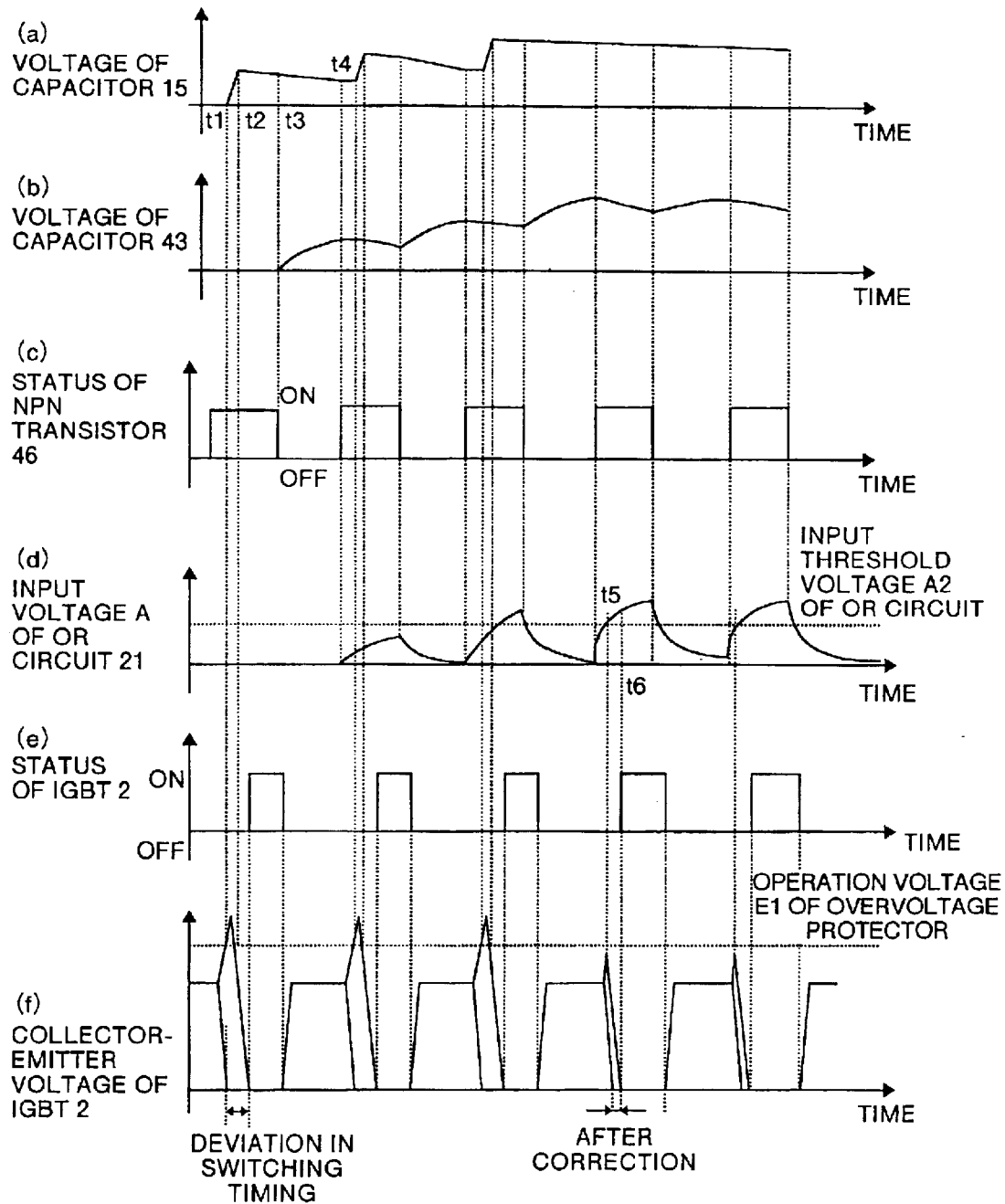

FIG. 10 shows a structure for correcting a deviation in the switching timing at the turn-on time, and FIG. 11 includes time charts for explaining this operation.

In the fifth embodiment, the signal holding circuit 13b includes a plurality of accumulators, and is constructed of an input resistor 14, a capacitor (a first accumulator) 15, a discharge resistor 24, a PNP transistor 45, a base resistor 29, and a capacitor (a second accumulator) 43, and a discharge resistor 44. A pulse formation circuit 16b is constructed of a resistor 25, an NPN transistor 46, a base resistor 31, a capacitor (a charger) 26, a discharge register 27, a delay circuit 20, and an OR circuit 21. The pulse formation circuit 16b causes a charge accumulated in the capacitor 43 of the signal holding circuit 13b to be charged to the capacitor 26 at each turn-on time, and forms a switching control signal that has been corrected based on this charge signal and a switching control signal from the control signal generator 1. In other words, the OR circuit 21 outputs an ON signal when an input charge voltage is equal to or above a threshold voltage, and finally adds this ON signal to the switching control signal from the control signal generator 1, and outputs this signal. The switching control signal is added as a signal that has been delayed by a predetermined time in the delay circuit 20.

The operation of the semiconductor equipment of the fifth embodiment will be explained next. In FIG. 11, (a) shows a change with time of a voltage of the capacitor (the first accumulator) 15, (b) shows a change with time of a voltage of the capacitor (the second accumulator) 43, (c) shows a change with time of a conduction status of the NPN transistor 46, (d) shows a change with time of an input voltage A of the OR circuit 21, (e) shows a change with time of a switching status of the IGBT 2, and (f) shows a change with time of a collector-emitter voltage of the IGBT 2. (a) to (f) show waveforms of a case in which two IGBT's are connected in series. (f) shows voltage waveforms of the IGBT of early turn-on and the IGBT of late turn-on. (a) to (e) show waveforms of the IGBT of late turn-on.

The input decision circuit 7b carries out a similar operation to that of the second embodiment. In the signal holding circuit 13b, the voltage of the capacitor 15 rises during a period (t1 to t2) when the collector-emitter voltage of the IGBT of late turn-on exceeds an operation voltage E1 of the overvoltage protector 6. The voltage of the capacitor 15 rises according to the operation of the overvoltage protector 6. When an OFF signal has been generated from the control signal generator 1 the PNP transistor 45 is turned on, and the voltage of the capacitor 43 rises to a level substantially equal to the voltage of the capacitor 15. In this case, the capacitance of the capacitor 15 is set larger than the capacitance of the capacitor 43 such that the voltage of the capacitor 15 is not lowered substantially. Thereafter, when an ON signal has been generated from the control signal generator 1, the NPN transistor 46 is turned on, and the voltage of the capacitor 26 rises to the voltage of the capacitor 43 at the time-constant of the capacitor 26 and the resistor 25. In this case, the capacitance of the capacitor 43 is set larger than the capacitance of the capacitor 26 such that the voltage of the capacitor 43 is not lowered substantially. When the voltage of the capacitor 26 becomes larger than an input threshold voltage A2 of the OR circuit 21 (at t5), the IGBT 2 is turned on. A command from the control signal generator 1 to the IGBT 2 has been delayed in advance in the delay circuit 20. Therefore, when there is a signal (a switching timing correction signal) from the signal holding circuit 13b, it is possible to early turn on the IGBT 2 to minimize the deviation in the switching timing. Capacitance and discharge resistance of the capacitor 43 and the capacitor 26 are set respectively such that the charges of the capacitor 43 and the capacitor 26 become lower than the threshold voltage before the ON/OFF signal generated from the control signal generator 1 changes from ON to OFF. Capacitance and discharge resistance of the capacitor 15 are set such that the capacitor 15 discharges in the time-constant of a few to dozens of cycles.

In the second embodiment, the logic circuit 18 is used to correct a deviation in the switching timing at the turn-on time at the rate of once per a plurality of times. However, in the fifth embodiment, the charge accumulated in the capacitor 15 is shifted to the capacitor 43 at each turn-on time and this is utilized. Therefore, it is possible to correct the deviation in the switching timing continuously at each turn-on time.

Further, it is possible to drive the PNP transistor 17 at the timing of the switching signal. Therefore, the logic circuit 18 that is used in the first and second embodiments becomes unnecessary.

Further, a switch or an impedance element having large impedance for limiting a current is connected between a plurality of capacitors (accumulators), thereby to prevent the information from flowing out from the overvoltage protector when the information accumulated in the signal holding circuit is output to the pulse formation circuit. With this arrangement, it is possible to prevent such a state that the information flows out straight from the overvoltage protector to the pulse formation circuit, causing a continued ON status of the IGBT or making it impossible to correct the deviation in the switching timing.

Figure 12:
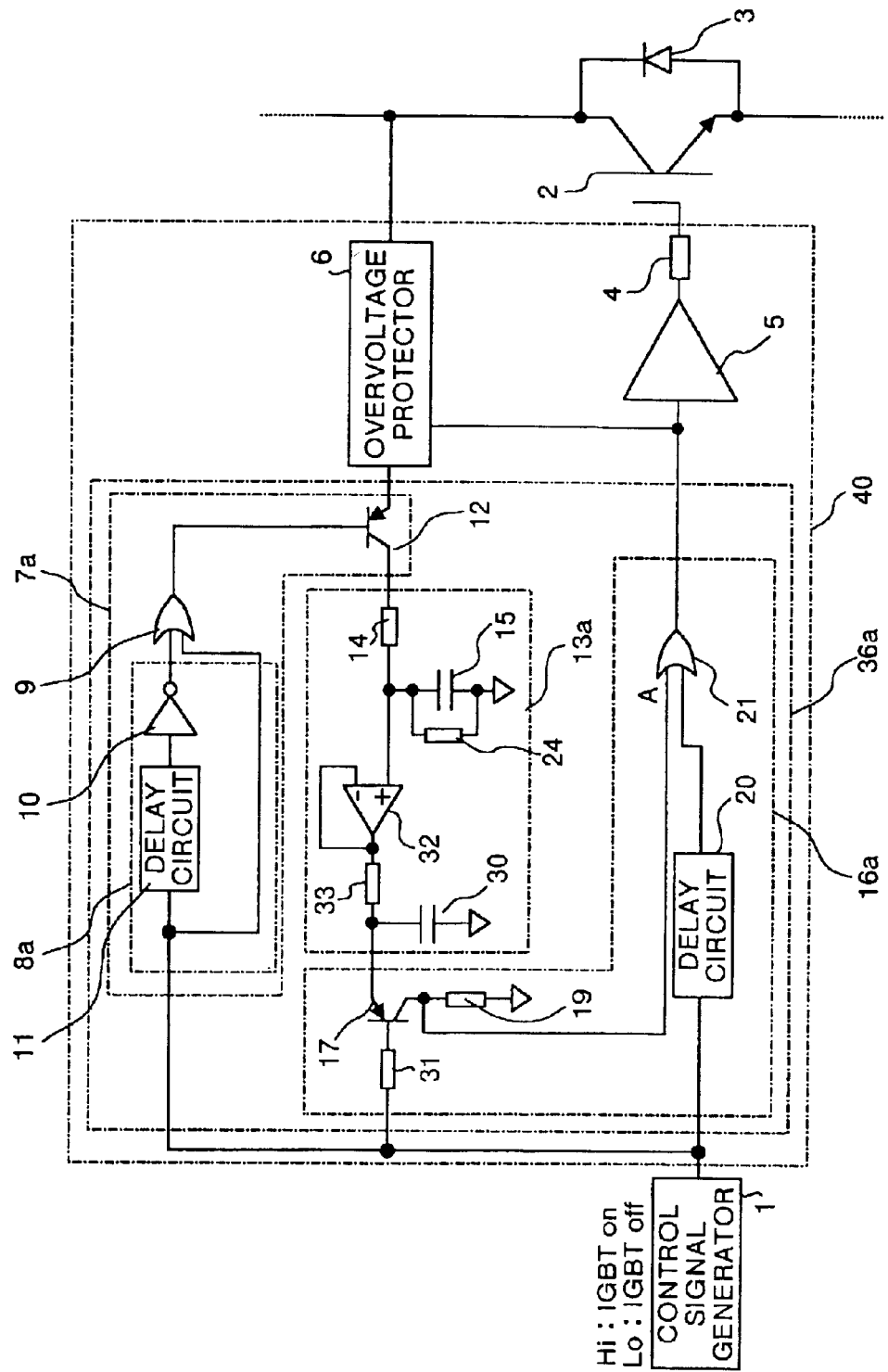
FIG. 12 is a circuit structure diagram that shows a main portion of a semiconductor equipment according to a sixth embodiment of the present invention.

The semiconductor equipment according to a sixth embodiment of the present invention will be explained with reference to FIG. 12. FIG. 12 shows a structure for correcting a deviation in the switching timing at the turn-off time. An input decision circuit 7a and the pulse formation circuit 16a are similar to those of the fourth embodiment. A signal holding circuit 13a is constructed of a buffer consisting of an operation amplifier 32, a resistor 33, a capacitor 30, an input resistor 14, a capacitor 15, and a discharge resistor 24. The structure of the sixth embodiment is different from that of the fourth embodiment in that the circuit consisting of the NPN transistor 28 and the base resistor 29 in the signal holding circuit 13a has been changed to an operation amplifier 32 and a resistor 33.

Resistances of the resistors 33 an 19 are selected suitably, in order to prevent the input voltage A of the OR circuit 21 from exceeding the input threshold voltage A1, based on the output current of the operation amplifier 32 when the PNP transistor 17 is ON.

As the buffer is used in the sixth embodiment, it is possible to minimize the deviation in the switching timing without losing the charge of the capacitor 15. The sixth embodiment represents a case in which the buffer is added in the semiconductor equipment of the fourth embodiment. In the same manner, it is also possible to add the buffer in the semiconductor equipment of the fifth embodiment.

Figure 13:
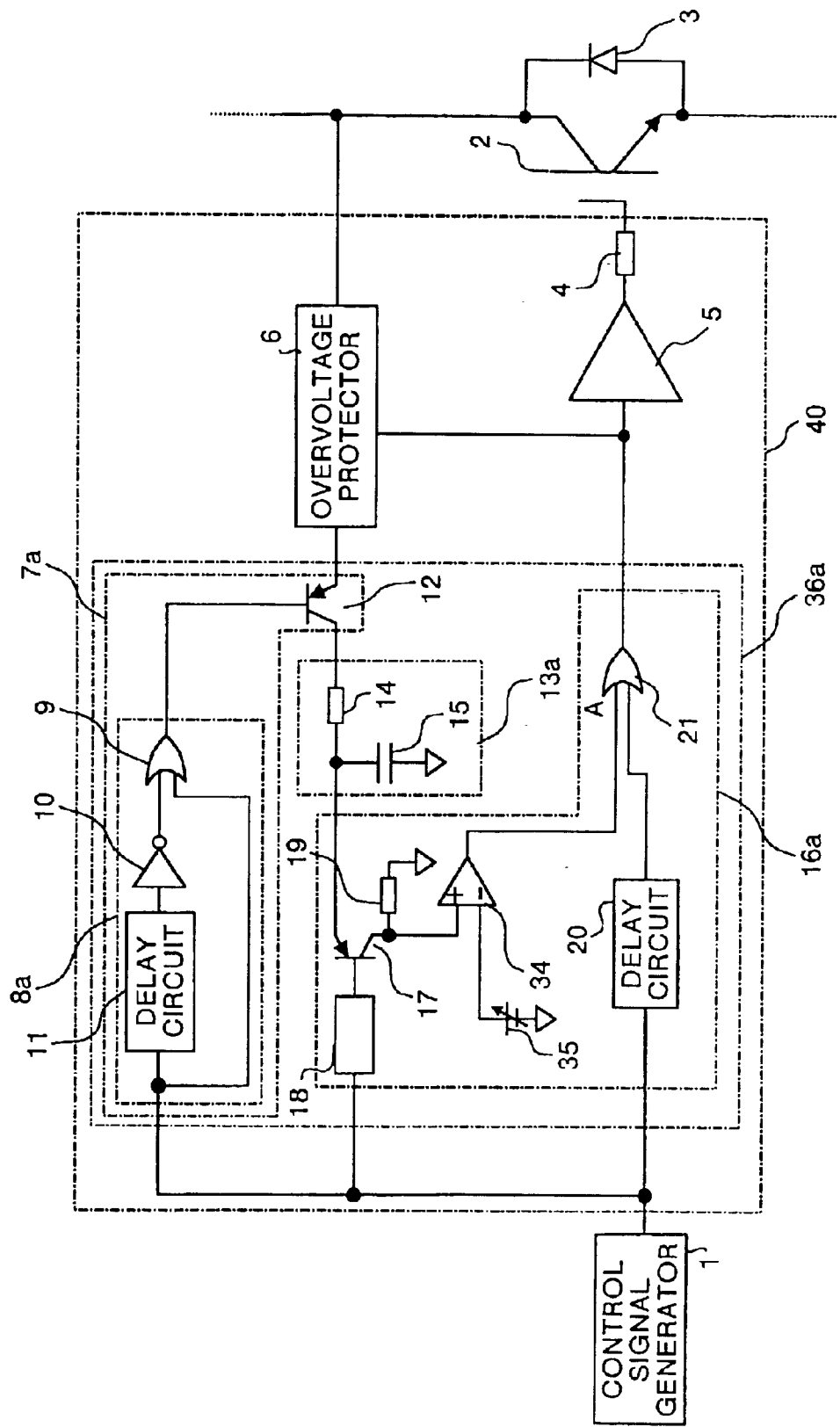
FIG. 13 is a circuit structure diagram that shows a main portion of a semiconductor equipment according to a seventh embodiment of the present invention.

The semiconductor equipment according to a seventh embodiment of the present invention will be explained with reference to FIG. 13. This semiconductor equipment has a structure for correcting a deviation in the switching timing at the turn-off time. The input decision circuit 7a and the signal holding circuit 13a are similar to those of the first embodiment. In the seventh embodiment, the pulse formation circuit 16a has a comparator 34, and a variable voltage supply (a variable unit) 35 that inputs a reference voltage, in front of an input A of an OR circuit 21 in the pulse formation circuit 16a of the first embodiment. The variable voltage supply 35 changes the reference voltage, thereby to equivalently change the input threshold voltage of the OR circuit 21. It is possible to optionally determine the switching timing correction timing for the operation of the overvoltage protector 6.

The seventh embodiment represents a case in which the reference voltage in the semiconductor equipment of the first embodiment is made variable. In the same manner, it is also possible to change the reference voltage by using the comparator and the variable voltage supply in the other embodiments described above.

Figure 14:
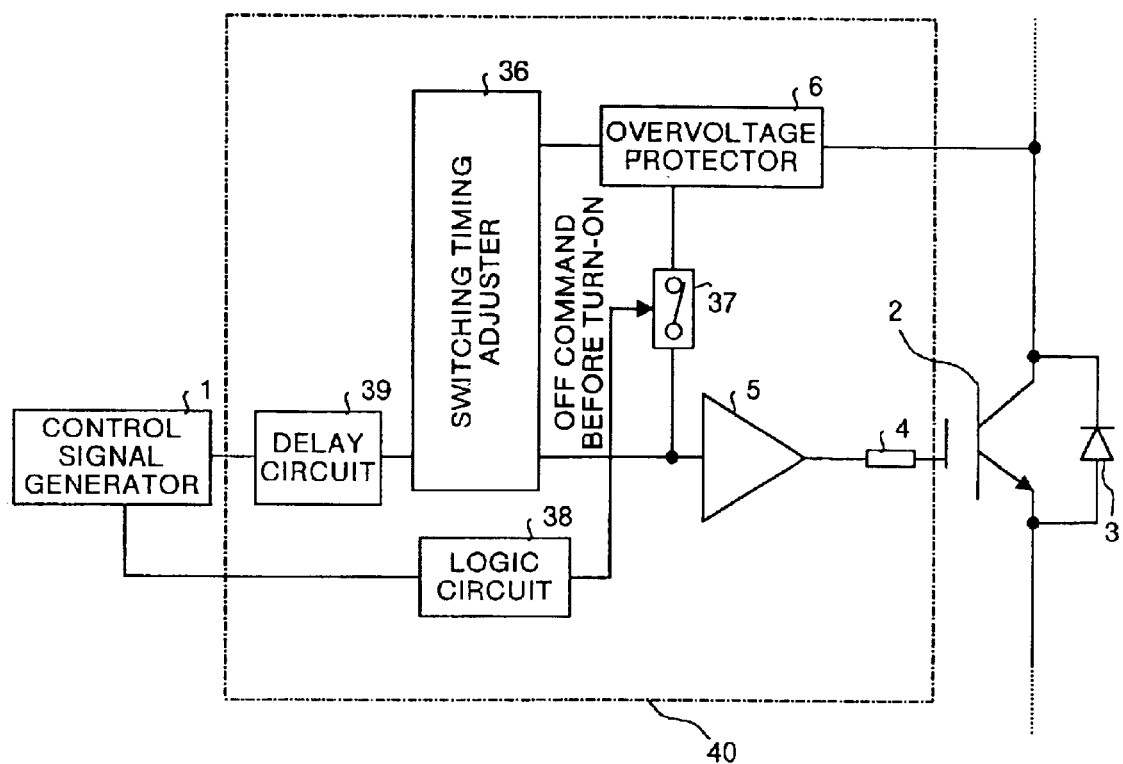
FIG. 14 is a circuit structure diagram that shows a main portion of a semiconductor equipment according to an eighth embodiment of the present invention.
Figure 15:
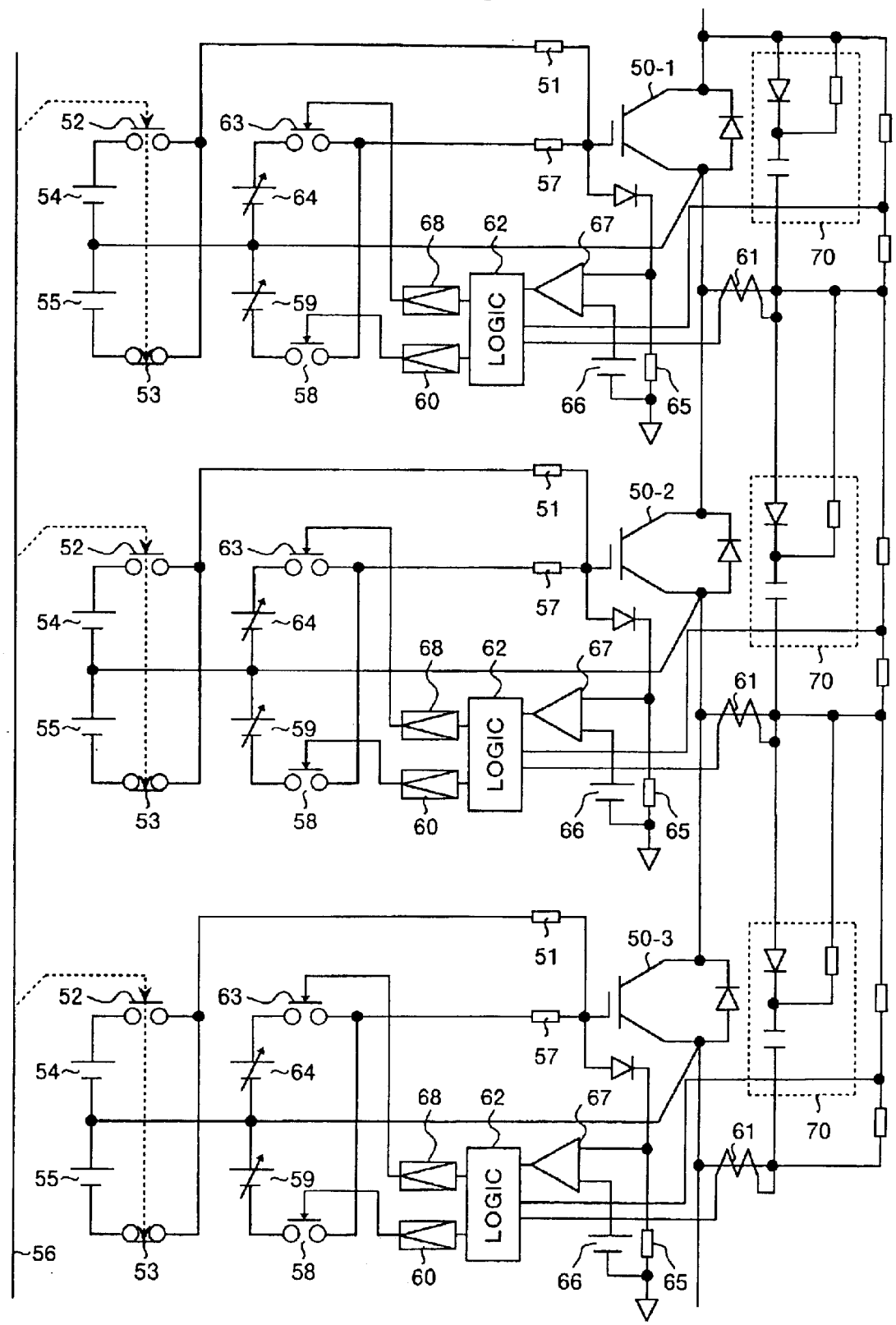
FIG. 15 is a circuit structure diagram that shows a prior art semiconductor equipment.

The semiconductor equipment according to an eighth embodiment of the present invention will be explained with reference to FIG. 14. This semiconductor equipment has a structure for correcting a deviation in the switching timing at the turn-on time. A reference number 37 denotes a switch that electrically disconnects the overvoltage protector 6 and the gate amplifier 5, and avoids applying influence to the switching of the IGBT 2. A reference number 38 denotes a logic circuit that receives a turn-on signal of the control signal generator 1, and transmits an off command to the switch 37 during an optional time. A reference number 39 denotes a delay circuit that delays a switching signal, thereby to position the off command of the logic circuit 38 to the switch 37 in front of the turn-on signal to the IGBT 2. In the eighth embodiment, the switching timing adjuster 36 is not always necessary. In the case of the overvoltage protector 6 of a system that controls a gate voltage, a gate voltage varies between the series-connected IGBT's 2 when the overvoltage protector 6 operates immediately before the turn-on. Therefore, a difference occurs between the series-connected IGBT's during the ON time too. As a result, a voltage of other IGBT is applied to the IGBT of which turn-on is delayed. The overvoltage is suppressed with the overvoltage protector 6, but the loss increases by the portion of the deviation in the turn-on timing. In the eighth embodiment, the overvoltage protector 6 is separated at a time of a constant time before the turn-on, thereby to make the gate voltages of the series-connected IGBT's 2 securely equal to each other. Therefore, it is possible to prevent a deviation in the switching timing at the turn-on-time due to the overvoltage protector 6. In other words, the overvoltage protector 6 is separated at a time of a constant time before the voltage of the IGBT rises to or above the rated voltage after the gate voltage is lowered to a voltage at the off-time of the IGBT.

As explained above, according to the semiconductor equipment of one aspect of the present invention, when there is a deviation in the switching timing between the series-connected self-extinction type semiconductors, the information about the deviation in the switching timing is detected from the overvoltage protector. Therefore, it is possible to properly reduce the deviation in the switching timing for each self-extinction type semiconductor.

Furthermore, it is possible to reduce the deviation in the switching timing at the rate of once per a plurality of times of switching. It is possible to reduce the deviation in the switching timing continuously for each switching timing. It is possible to prevent such a state that the information flows out straight from the overvoltage protector to the pulse formation circuit, causing a continued ON status of the IGBT or making it impossible to correct the deviation in the switching timing. It is possible to correct the deviation in the switching timing at the turn-off time. It is possible to correct the deviation in the switching timing at the turn-on time. It is possible to adjust the correction time of the deviation in the switching timing.

Moreover, according to the semiconductor equipment of another aspect of the present invention, the gate voltages of the series-connected IGBT's before the turn-on time become equal to each other. Therefore, it is possible to prevent a deviation in the switching timing at the turn-on time due to the disturbance by the overvoltage protector.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor equipment including:
    a plurality of self-extinction semiconductors connected in series;
    an overvoltage protector connected to each self-extinction semiconductor, protecting said self-extinction semiconductor when an overvoltage occurs in said self-extinction semiconductor;
    a control signal generator that generates a switching control signal for controlling said self-extinction semiconductor; and
    a switching timing adjuster connected between a control terminal of each self-extinction semiconductor and said control signal generator, said switching timing adjuster comprising an input decision circuit that decides whether a signal output from said overvoltage protector has been output based on an overvoltage applied to said self-extinction semiconductor due to a deviation in the switching timing at a turn-on or turn-off time, a signal holding circuit that holds a signal corresponding to the overvoltage that is output from said input decision circuit, and a pulse formation circuit that forms a corrected switching control signal based on a signal held in said signal holding circuit and a switching control signal from said control signal generator.

2. The semiconductor equipment according to claim 1, wherein said pulse formation circuit includes a logic circuit that receives a signal held in said signal holding circuit once per a plurality of times of switching.

3. The semiconductor equipment according to claim 1, wherein said signal holding circuit includes a first accumulator that holds a signal from said overvoltage protector;

a second accumulator that holds a signal output to said pulse formation circuit; and a switch or an impedance element that limits a current, connected to said accumulators, wherein said second accumulator has a capacitance smaller than capacitance of said first accumulator.

4. The semiconductor equipment according to claim 1, wherein said pulse formation circuit causes a signal held in said signal holding circuit to be discharged at the turn-off time, and corrects switching timing at the turn-off time using the signal discharged.

5. The semiconductor equipment according to claim 1, wherein said pulse formation circuit includes a charger that charges a signal held in said signal holding circuit at the turn-on time, and corrects switching timing at the turn-on time using the signal charged.

6. The semiconductor equipment according to claim 1, wherein said pulse formation circuit includes a comparator that receives a signal from said signal holding circuit and outputs a signal if a level of the input signal is at least equal to a reference level; and a variable unit which changes the reference level of said comparator.

7. A semiconductor equipment including:

a plurality of self-extinction semiconductors connected in series;

an overvoltage protector connected to each self-extinction semiconductor; and a switch that electrically disconnects said self-extinction semiconductor and said overvoltage protector before said self-extinction semiconductor is turned on.

8. A semiconductor equipment comprising:

a plurality of self-extinction semiconductors connected in series, each of said self-extinction semiconductors having a control terminal; and a control signal generator that generates a switching control signal for controlling said self-extinction semiconductors, wherein, corresponding to each of said self-extinction semiconductors there are provided an overvoltage protector that protects said self-extinction semiconductor when an overvoltage occurs in said self-extinction semiconductor; and a switching timing adjuster provided between said control terminal of said self-extinction semiconductor and said control signal generator, said switching timing adjuster having an input decision circuit that decides whether a signal output from said overvoltage protector is a signal that has been output based on occurrence of an overvoltage in said self-extinction semiconductor due to a deviation in the switching timing at a turn-on or turn-off time;

a signal holding circuit that holds a signal corresponding to the overvoltage that is output from said input decision circuit; and a pulse formation circuit that forms a corrected switching control signal based on a signal held in said signal holding circuit and a switching control signal from said control signal generator.

* * * * *